US012562454B2

(12) United States Patent
Ho et al.

(10) Patent No.: US 12,562,454 B2
(45) Date of Patent: Feb. 24, 2026

(54) SEMICONDUCTOR DEVICE PACKAGE

(71) Applicant: Advanced Semiconductor Engineering, Inc., Kaohsiung (TW)

(72) Inventors: Cheng-Yu Ho, Kaohsiung (TW); Meng-Wei Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 962 days.

(21) Appl. No.: 17/676,088

(22) Filed: Feb. 18, 2022

(65) Prior Publication Data

US 2023/0268638 A1 Aug. 24, 2023

(51) Int. Cl.
H01Q 1/22 (2006.01)
H01L 23/66 (2006.01)

(52) U.S. Cl.
CPC ........... H01Q 1/2283 (2013.01); H01L 23/66 (2013.01); H01L 2223/6677 (2013.01)

(58) Field of Classification Search
CPC .... H01Q 1/2283; H01Q 21/065; H01L 23/66; H01L 2223/6677; H01L 23/552; H01L 2223/6616
See application file for complete search history.

(56) References Cited

U.S. PATENT DOCUMENTS

| | | | |
|---|---|---|---|
| 8,718,550 B2 | 5/2014 | Zhao et al. | |
| 10,263,332 B2 | 4/2019 | Yong et al. | |
| 11,978,948 B2 * | 5/2024 | Nair .................... | H01L 23/5383 |
| 2018/0205155 A1 | 7/2018 | Mizunuma et al. | |
| 2019/0097301 A1 * | 3/2019 | Wu .......................... | H05K 5/03 |
| 2019/0341697 A1 * | 11/2019 | Yamauchi ............... | H01L 23/66 |
| 2022/0102831 A1 * | 3/2022 | Igarashi ............. | H01Q 15/0073 |
| 2022/0262747 A1 * | 8/2022 | Chiu .................... | H01Q 21/065 |
| 2023/0012815 A1 * | 1/2023 | Reichman ............ | H01Q 1/2283 |
| 2023/0124600 A1 * | 4/2023 | Akhtar ................. | H05K 1/0245 |
| | | | 333/25 |
| 2023/0207499 A1 * | 6/2023 | Lin .................... | H01L 23/49833 |
| | | | 257/728 |

* cited by examiner

*Primary Examiner* — Eliseo Ramos Feliciano
*Assistant Examiner* — Thaddeus J Kolb
(74) *Attorney, Agent, or Firm* — FOLEY & LARDNER LLP

(57) ABSTRACT

The present disclosure provides a semiconductor device package. The semiconductor device package includes a first antenna pattern disposed at a first elevation and a second antenna pattern disposed at a second elevation different from the first elevation. The first antenna pattern and the second antenna pattern define an air cavity. The semiconductor device package also includes a circuit layer. The air cavity is between the first antenna pattern, the second antenna pattern, and the circuit layer.

12 Claims, 6 Drawing Sheets

<u>6</u>

6

SEMICONDUCTOR DEVICE PACKAGE

BACKGROUND

1. Technical Field

The present disclosure relates to a semiconductor device package.

2. Description of the Related Art

Semiconductor device package(s) utilizing antennas for signal (e.g. radio frequency (RF) signal) transmission may include an antenna layer and a circuit layer electrically connected thereto. To support fifth generation (5G) and/or millimeter (mm) wave communications, the antenna layer generally comprises a substrate of relatively high thickness. In addition, an antenna array including a plurality of antenna units may be employed. Cumulatively, package size is inevitably increased.

SUMMARY

In some embodiments, a semiconductor device package includes a first antenna pattern disposed at a first elevation and a second antenna pattern disposed at a second elevation different from the first elevation. The first antenna pattern and the second antenna pattern define an air cavity. The semiconductor device package also includes a circuit layer. The air cavity is between the first antenna pattern, the second antenna pattern, and the circuit layer.

In some embodiments, a semiconductor device package includes a carrier having a curved surface defining a cavity, an antenna array conformal with the curved surface, and an electronic component under the carrier and electrically connected with the antenna array.

In some embodiments, a semiconductor device package includes a circuit layer and an antenna element. The antenna element includes a fixing part attached to the circuit layer and a curved part spaced apart from the circuit layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figures 1A, 1B:
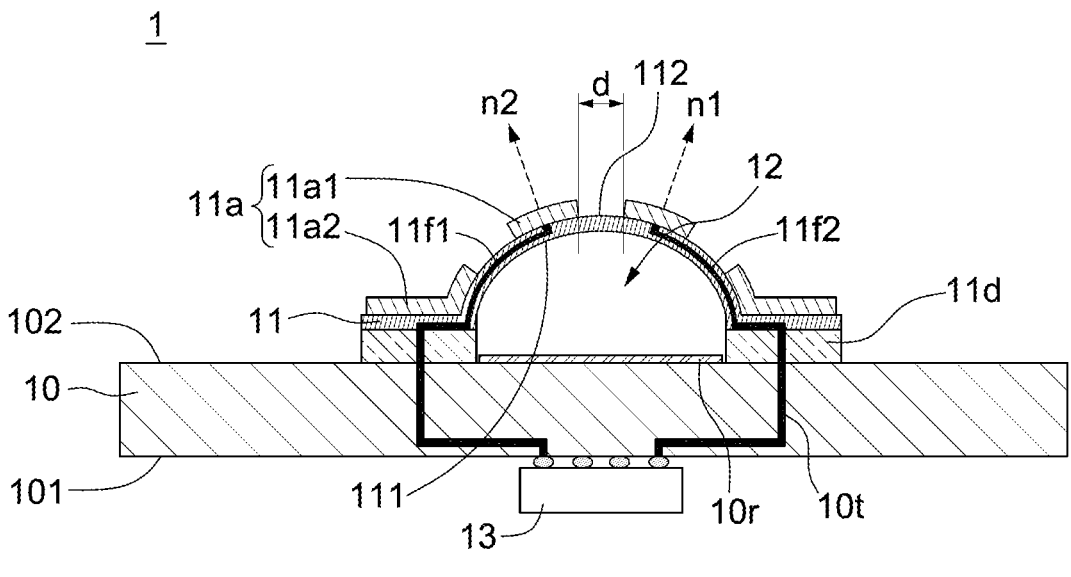
FIG. 1A illustrates a cross-sectional view of a semiconductor device package in accordance with some embodiments of the present disclosure.
FIG. 1B illustrates a top view of an antenna element in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description involves a semiconductor device package and a method of manufacturing a semiconductor device package.

FIG. 1 illustrates a cross-sectional view of a semiconductor device package 1 in accordance with some embodiments of the present disclosure. In some embodiments, the semiconductor device package 1 may be or include, for example, an antenna device or an antenna package. In some embodiments, the semiconductor device package 1 may be or include, for example, a wireless device, such as user equipment (UE), a mobile station, a mobile device, an apparatus communicating with the Internet of Things (IoT), and others.

In some embodiments, the semiconductor device package 1 may include a circuit layer 10, an antenna element 11, and an electronic component 13.

In some embodiments, the circuit layer (or a routing layer) 10 may be, for example, a substrate. The circuit layer 10 may be, for example, a printed circuit board, such as a paper-based copper foil laminate, a composite copper foil laminate, or a polymer-impregnated glass-fiber-based copper foil laminate. The circuit layer 10 may have a surface 101 and a surface 102 opposite to the surface 101. In some embodiments, the surface 101 and the surface 102 may be substantially parallel.

In some embodiments, the circuit layer 10 may include conductive pad(s), trace(s), via(s), or other interconnection(s). For example, the circuit layer 10 may include one or more conductive pads (not shown in the figures) in proximity to, adjacent to, or embedded in and exposed by the surface 101 and/or the surface 102 of the circuit layer 10. The circuit layer 10 may include a solder resist (not shown in the figures) on the surface 101 and/or the surface 102 to fully or partially expose at least a portion of the conductive pads for electrical connection of the antenna element 11 and the electronic component 13.

For example, the circuit layer 10 may include one or more transmission lines 10*t* (e.g., communications cables). In some embodiments, the transmission lines 10*t* may extend through a part of the circuit layer 10 (such as a dielectric layer thereof). In some embodiments, the transmission lines 10*t* may electrically connect one or more feeding lines 11*f*1 and 11*f*2 of the antenna element 11 to the electronic component 13. In some embodiments, the transmission lines 10*t* and the feeding lines 11*f*1 and 11*f*2 may be configured to transmit a signal (e.g., radio frequency (RF) current) to one of the antenna units 11*a* of the antenna element 11.

For example, the circuit layer 10 may include a reference layer 10*r* (e.g., a grounding layer or a grounding plane). The reference layer 10*r* may be disposed adjacent to the surface 102 of the circuit layer 10. In some embodiments, the reference layer 10*r* may be configured to provide a return path for the signal (e.g., RF current) of the antenna units 11*a* of the antenna element 11 and reduce antenna noise. In some embodiments, the electromagnetic waves radiated or transmitted by the antenna units 11*a* of the antenna element 11 may be reflected by the reference layer 10*r*, and thus antenna gain can be increased.

The antenna element 11 may be disposed on or above the surface 102 of the circuit layer 10. The antenna element 11 may be attached to the surface 102 of the circuit layer 10 by an adhesive layer 11*d*. In some embodiments, the adhesive layer 11*d* may include thermoset tape, which can be thermally and/or optically cured to provide adhesion. By way of example, the material of the adhesive layer 11*d* may be a thermoset gel including a monomer such as a resin monomer, hardener, catalyst, solvent, diluent, fillers, and other additives.

The antenna element 11 may include a plurality of antenna units 11*a* and a carrier for supporting the antenna units 11*a*. The antenna element 11 (or the carrier thereof) may have a surface 111 facing the circuit layer 10 and a surface 112 opposite to the surface 111. The antenna units 11*a* may be disposed on the surface 112. In some embodiments, the antenna units 11*a* may protrude from the surface 112. However, in some other embodiments, the antenna units 11*a* may be substantially coplanar with the surface 112.

In some embodiments, the antenna element 11 (or the carrier thereof) may be curved, bowed, or bent. For example, the antenna element 11 (or the carrier thereof) may have a curvature with respect to the surface 101 and/or the surface 102 of the circuit layer 10. For example, the antenna element 11 (or the carrier thereof) may be non-parallel with the surface 101 and/or the surface 102 of the circuit layer 10. For example, from a cross-section, the antenna element 11 (or the carrier thereof) may have an end (or a side) connecting to the circuit layer 10, another end (or another side) connecting to the circuit layer 10, and a portion between the two ends and physically separated from the circuit layer 10. In some embodiments, the ends connecting to the circuit layer 10 may be fixing parts of the antenna element 11 configured to attach the antenna element 11 on the circuit layer 10. The portion between the ends may be a curved part spaced apart from the circuit layer 10.

In some embodiments, the antenna element 11 (or the carrier thereof) and the circuit layer 10 may define an air cavity 12. For example, the air cavity 12 may be the space between the surface 102 of the circuit layer 10 and the surface 111 of the antenna element 11 (or the carrier thereof). In some embodiments, the air cavity 12 may be an empty space. In some embodiments, the air cavity 12 may serve as a resonant cavity. For example, the air cavity 12 may function as a resonant cavity. For example, the electromagnetic waves radiated or transmitted by the antenna units 11*a* of the antenna element 11 may resonate in the air cavity 12.

In some embodiments, the air cavity 12 may expose a part of the surface 102 of the circuit layer 10. For example, a part of the surface 102 of the circuit layer 10 may be uncovered. For example, the air cavity 12 may expose at least a part of the reference layer 10*r*. For example, at least a part of the reference layer 10*r* may be uncovered. In some embodiments, the air cavity 12 may expose a part of the surface 111 of the antenna element 11 (or the carrier thereof). For example, a part of the surface 111 of the antenna element 11 (or the carrier thereof) may be uncovered.

In some embodiments, the antenna element 11 may be physically separated from the reference layer 10*r* by the air cavity 12.

In some embodiments, the antenna units 11*a* may define or include an antenna pattern. For example, the antenna units 11*a* may define or include an antenna array. For example, the antenna units 11*a* may be arranged in an array. For example, the antenna units 11*a* may be spaced apart from one another. In some embodiments, a distance "d" (e.g., the shortest distance) between two adjacent antenna units may be less than a half of a wavelength of the electromagnetic waves radiated by the two adjacent antenna units.

In some embodiments, since the antenna units 11*a* are disposed on a curved surface (e.g., the surface 112), the antenna units 11*a* may each have a curved appearance. In some embodiments, the antenna units 11*a* may be conformal with the curved surface of the antenna element 11. In some embodiments, the antenna units 11*a* may each be disposed at different elevations with respect to the circuit layer 10. For example, the antenna units 11*a* may each be disposed at different elevations with respect to the reference layer 10*r*. For example, the distance between one of the antenna units 11*a* and the circuit layer 10 may differ from the distance between another of the antenna units 11*a* and the circuit layer 10.

In some embodiments, the normal lines (e.g., the normal lines n1 and n2) of the antenna units 11*a* may extend in different directions. For example, the normal lines (e.g., the normal lines n1 and n2) of the antenna units 11*a* may be non-parallel. In some embodiments, an angle defined by the normal lines (e.g., the normal lines n1 and n2) of two adjacent antenna units 11*a* may be less than 90 degrees. In some embodiments, the antenna units 11*a* may be configured to radiate electromagnetic waves in multiple directions.

In some embodiments, the antenna units 11*a* may have different frequencies (or operating frequencies) or bandwidths (or operating bandwidths). For example, the antenna units 11*a* may be configured to radiate electromagnetic waves of different frequencies or different bandwidths. For example, the antenna unit 11a1 may have an operating frequency higher than an operating frequency of the antenna unit 11a2, or vice versa. For example, the antenna unit at a higher elevation may have an operating frequency higher than an operating frequency of the antenna unit at a lower elevation, or vice versa. For example, the antenna unit 11a1 may be operated at a frequency of about 39 GHz and the antenna unit 11a2 may be operated at a frequency of about 28 GHz, or vice versa.

In some embodiments, the antenna units 11a may each include a patch antenna, such as a planar inverted-F antenna (PIFA) or other feasible type. In some embodiments, the antenna units 11a may each include a conductive material such as metal or metal alloy. Examples of the conductive material include gold (Au), silver (Ag), aluminum (Al), copper (Cu), platinum (Pt), Palladium (Pd), other metal(s) or alloy(s), or a combination of two or more thereof.

In some embodiments, the carrier of the antenna element 11 supporting the antenna units 11a may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like.

In some embodiments, the feeding lines 11f1 and 11f2 may extend within the carrier and electrically connect the transmission lines 10t to one of the antenna units 11a of the antenna element 11. In some embodiments, the feeding lines 11f1 and 11f2 may extend through the carrier, the adhesive layer 10d, and then extend into the circuit layer 10.

In some embodiments, the electronic component 13 and the antenna element 11 may be disposed on opposite sides of the circuit layer 10. The electronic component 13 may be disposed on the surface 101 of the circuit layer 10. The electronic component 13 may be external to the air cavity 12. For example, the electronic component 13 may be disposed outside of the air cavity 12.

The electronic component 13 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some embodiments, the electronic component 13 may include a transmitter, a receiver, or a transceiver. In some embodiments, the electronic component 13 may include a radio frequency IC (RFIC). In some embodiments, there may be any number of electronic components depending on design requirements.

The electronic component 13 may be electrically connected to one or more other electrical components and to the circuit layer 10, and the electrical connections may be attained by way of flip-chip or wire-bond techniques. The electronic component 13 may be electrically connected to the antenna element 11. In some embodiments, the signal transmission path may be attained by the transmission lines 10t in the circuit layer 10 and the feeding lines 11f1 and 11f2 of the antenna element 11.

According to some embodiments of the present disclosure, by incorporating the antenna units 11a having different operating frequencies, the semiconductor device package 1 may achieve multi-band (or multi-frequency) radiation. In some embodiments, since the antenna element 11 is curved, the size of the semiconductor device package 1 along the x/y axis (e.g., parallel to the surface 101 and/or 102 of the circuit layer 10) can be reduced. In addition, the electromagnetic waves radiated by the antenna units 11a can interfere (such as in a far field) with one another, and the radiation directivity and the antenna gain thereof can be increased.

Furthermore, the air cavity 12 between the antenna element 11 and the circuit layer 10 can serve as a resonant cavity. The air cavity 12 has a relatively lower dielectric constant (Dk) than the carrier of the antenna element 11, and the thickness of the antenna element 11 can be reduced. The signal transmission loss of the semiconductor device package 1 can be mitigated, and the antenna gain of the semiconductor device package 1 can be increased.

FIG. 1B illustrates a top view of an antenna element in accordance with some embodiments of the present disclosure. In some embodiments, the top view of the antenna element in FIG. 1B may be the top view of the antenna element 11 in FIG. 1A. In some embodiments, the dotted circle may represent a boundary 12b of the air cavity 12 in FIG. 1A.

In some embodiments, the antenna units 11a1 and 11a2 of the antenna element 11 may have different dimensions, sizes, or areas. For example, the antenna units 11a1 (which may have a higher operating frequency) may be smaller than the antenna units 11a2 (which may have a lower operating frequency).

In some embodiments, the antenna units 11a1 may be within the boundary 12b. In some embodiments, the antenna units 11a1 may be arranged in an array. In some embodiments, the antenna units 11a2 may be at the boundary 12b. For example, the boundary 12b may traverse or pass through the antenna units 11a2. For example, the antenna units 11a2 may have a portion substantially parallel with the surface 101 and/or the surface 102 of the circuit layer 10 in FIG. 1A. In some embodiments, the antenna units 11a2 may surround the antenna units 11a1. In some embodiments, the antenna units 11a2 may be disposed around the antenna units 11a1. In some embodiments; the antenna units 11a2 may be arranged along the boundary 12b. In some embodiments, the antenna units 11a2 may be arranged in a circle.

The patterns or sequences of the antenna units may be different from the descriptions provided, and illustrations and the patterns or sequences of the antenna units may not be limited thereto. In some embodiments, antenna units of more than two different frequencies or bandwidths may be incorporated in the semiconductor device package 1.

Figure 2:
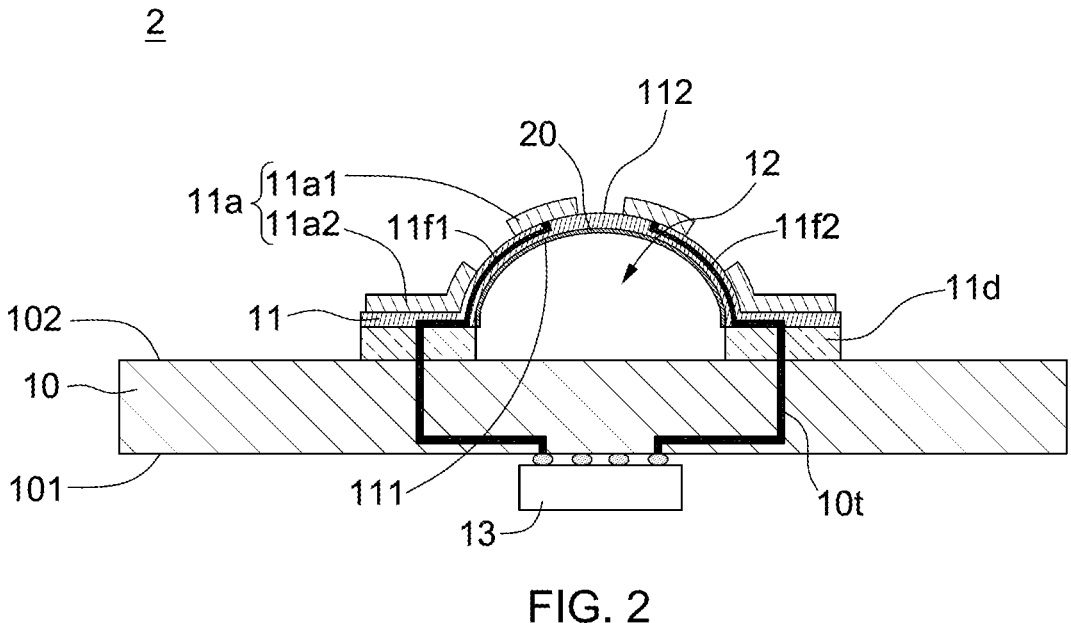
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 of FIG. 2 is similar to the semiconductor device package 1 in FIG. 1A, differing as follows.

The reference layer 20 may be disposed on the surface 111 of the antenna element 11 (or the carrier thereof). The reference layer 20 may be disposed between the antenna element 11 and the electronic component 30. The reference layer 20 may be disposed under the antenna units 11a. The reference layer 20 and the antenna units 11a may be disposed on opposite sides of the antenna element 11. In some embodiments, the reference layer 20 may be a part of the antenna element 11.

In such an arrangement, the air cavity 12 may be located between the reference layer 20 and the circuit layer 10. The reference layer 20 may be physically separated from the circuit layer 10 by the air cavity 12.

Figure 3:
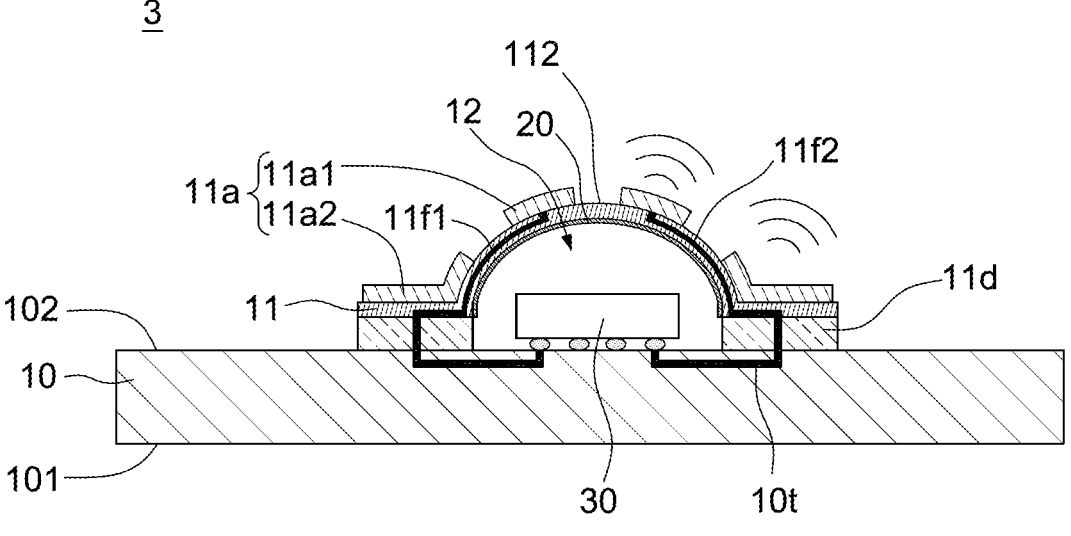
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 of FIG. 3 is similar to the semiconductor device package 2 in FIG. 2, differing as follows.

The electronic component 30 may be disposed at least partially within the air cavity 12. Therefore, the package size may be further reduced. In some embodiments, the electronic component 30 may be separated from the antenna element 11 by the reference layer 20.

In some embodiments, the reference layer 20 may be configured to provide an electromagnetic interference (EMI) shielding protection for the electronic component 30. For example, the reference layer 20 may be configured to provide an EMI shielding to prevent the electronic component 30 from being interfered with by other electronic components or the antenna element 11, and vice versa.

Figure 4:
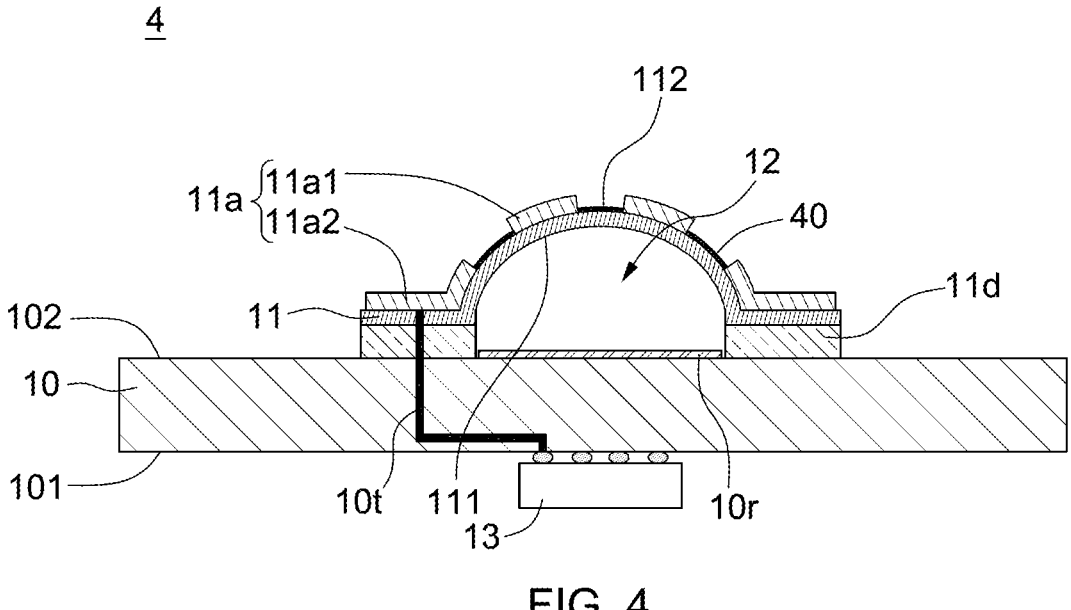
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 of FIG. 4 is similar to the semiconductor device package 1 in FIG. 1A, differing as follows.

The feeding line 40 may be disposed on the surface 112 of the antenna element 11 (or the carrier thereof). The feeding line 40 may be electrically connected to more than one of the antenna units 12*a* while the feeding lines 11*f*1 and 11*f*2 of the semiconductor device package 1 may each be electrically connected to a corresponding antenna unit. Therefore, the feeding line 40 may be configured to transmit a signal (e.g., radio frequency (RF) current) to more than one of the antenna units 12*a*.

Figure 5:
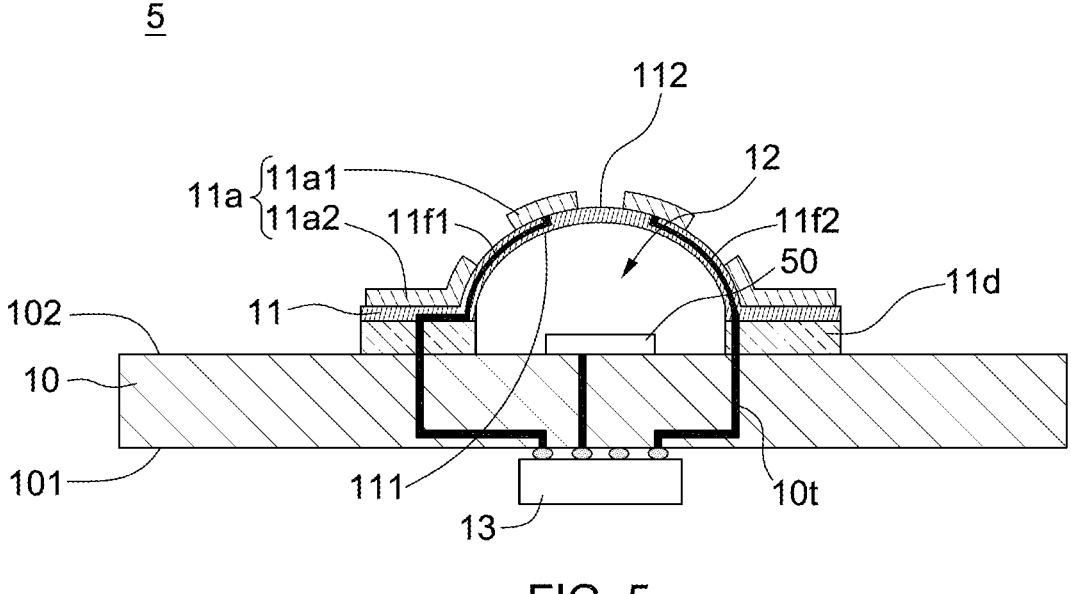
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 of FIG. 5 is similar to the semiconductor device package 1 in FIG. 1A, differing as follows.

The semiconductor device package 5 may further include an antenna element 50 adjacent to the circuit layer 10. The antenna element 50 may be electrically connected to the electronic component 13. The antenna element 50 may be physically separated from the antenna element 11 by the air cavity 12. The antenna element 50 may be disposed within the air cavity 12.

In some embodiments, the antenna element 50 may be or may include a patch antenna, such as a PIFA or other feasible antenna type. In some embodiments, the antenna element 50 may be configured to radiate electromagnetic waves to the antenna element 11 through the air cavity 12. In some embodiments, the antenna element 50 may couple to the antenna element 11 through the air cavity 12.

In some embodiments, the antenna element 11 may be configured to function as a filter, such as a frequency selective surface (FSS), for the antenna element 50 to increase the antenna gain. In some embodiments, the antenna element 11 may be configured to reflect, transmit, or absorb the electromagnetic waves of the antenna element 50, depending on the frequency of the electromagnetic waves and the resonant frequency of the antenna element 11. In some embodiments, the antenna element 11 may include a pattern, such as a regular or periodic pattern. The resonant frequency of the antenna element 11 may be designed by the pattern.

Figure 6:
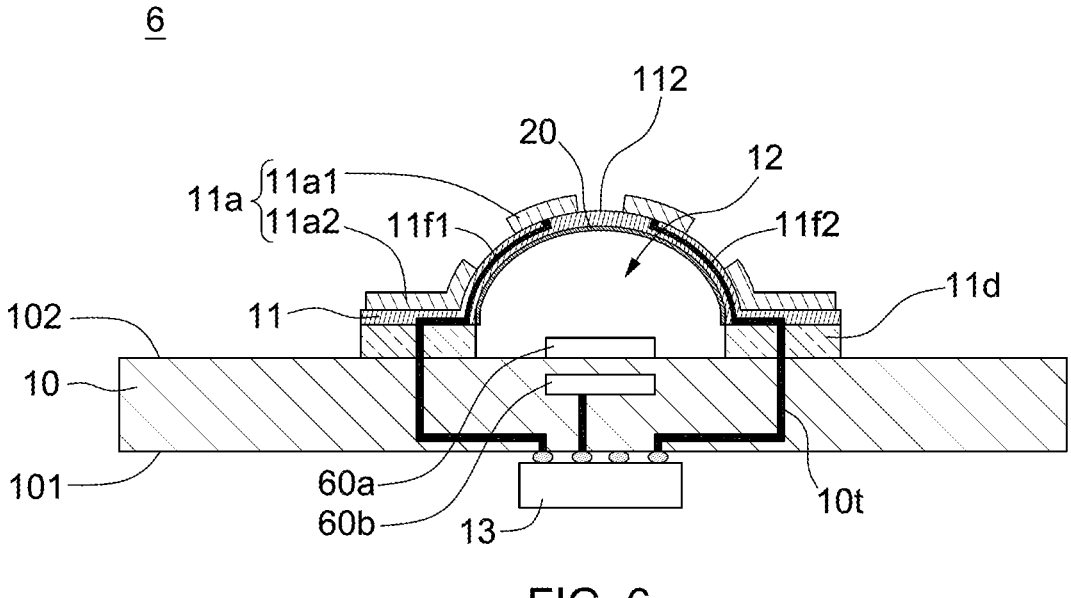
FIG. 6 illustrates a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 of FIG. 6 is similar to the semiconductor device package 5 in FIG. 5, differing as follows.

The semiconductor device package 6 may include stacked antenna units 60*a* and 60*b*, such as stacked patch antennas. The antenna unit 60*b* may be electrically connected to the electronic component 13. Signal transmission between the antenna units 60*a* and 60*b* may be accomplished through coupling.

Figure 7A:
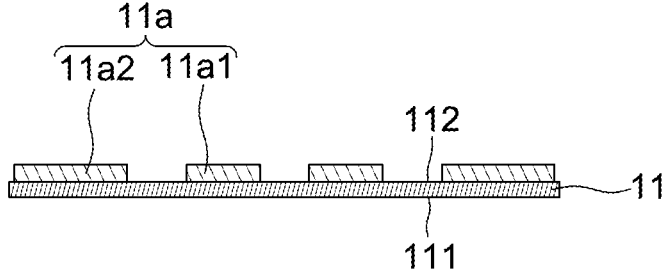
FIG. 7A illustrates one or more stages of a method of manufacturing a semiconductor device package in accordance with some embodiments of the present disclosure.
Figure 7B:
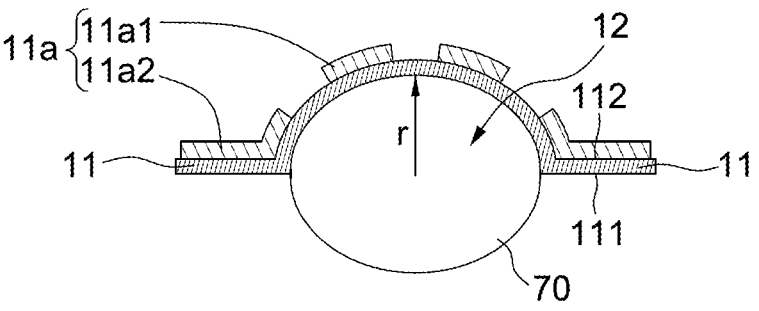
FIG. 7B illustrates one or more stages of a method of manufacturing a semiconductor device package in accordance with some embodiments of the present disclosure.
Figure 7C:
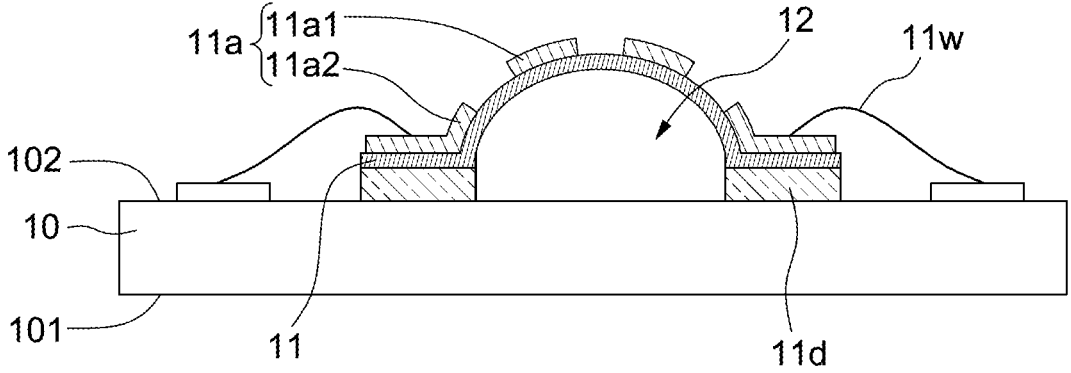
FIG. 7C illustrates one or more stages of a method of manufacturing a semiconductor device package in accordance with some embodiments of the present disclosure.

FIGS. 7A, 7B, and 7C illustrate stages of a method of manufacturing a semiconductor device package in accordance with some embodiments of the present disclosure. In some embodiments, the semiconductor device package 1 in FIG. 1A may be manufactured by the following operations with respect to FIGS. 7A, 7B, and 7C.

Referring to FIG. 7A, an antenna element 11 is provided, and may include a plurality of antenna units 11*a* (including the antenna units 11*a*1 and 11*a*2) and a carrier for supporting the antenna units 11*a*. The antenna element 11 (or the carrier thereof) may have the surface 111 and the surface 112 opposite to the surface 111. The antenna units 11*a* may be disposed on the surface 112. In some embodiments, the carrier of the antenna element 11 for supporting the antenna units 11*a* may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like.

Referring to FIG. 7B, the antenna element 11 may be heated to form a curved shape or appearance. In some embodiments, the antenna element 11 may be shaped by a molding tool. In some embodiments, the antenna element 11 may be shaped by compression molding. In some embodiments, the antenna element 11 may be shaped to have a radius of curvature.

Referring to FIG. 7C, a circuit layer 10 may be provided and the antenna element 11 may be attached to the circuit layer 10 through an adhesive layer 11*d*. As mentioned, the adhesive layer 11*d* may include thermoset tape, which can be thermally and/or optically cured to provide adhesion.

In some other embodiments, feeding lines (such as the feeding lines 11*f*1 and 11*f*2 in FIG. 1A) may be pre-formed in the antenna element 11 and the feeding lines may be connected to the transmission lines (such as the transmission lines 10*t* in FIG. 1A) in the circuit layer 10.

However, in some other embodiments, as shown in FIG. 7C, the antenna units 11*a* may be electrically connected to a conductive pad 10*p* on the circuit layer 10 through one or more wires 11*w*. For example, since the antenna element 11 is curved, the size of the antenna element 11 along the x/y axis (e.g., parallel to the surface 101 and/or 102 of the circuit layer 10) can be reduced, and more space is available for arranging the wires. Signal may be fed into the antenna units 11*a* through the wire 11*w*. Therefore, there may be no feeding lines (such as the feeding lines 11*f*1 and 11*f*2 in FIG. 1A) extending through the antenna element 11 and the adhesive layer 10*d*.

Figure 8:
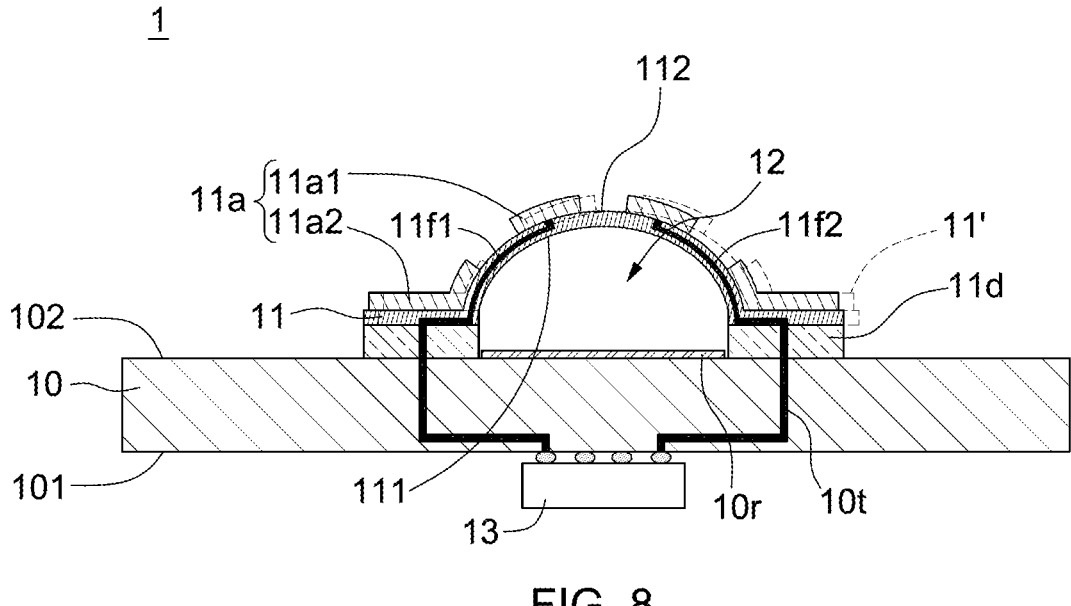
FIG. 8 illustrates a cross-sectional view of a semiconductor device package in accordance with some embodiments of the present disclosure.

FIG. 8 illustrates a cross-sectional view of the semiconductor device package 1 in FIG. 1A when the semiconductor device package 1 is being moved (e.g., vibrated, rotated, turned upside down, shifted, or so on) from its original position or normal stationary position.

The antenna element 11 includes a fixing part attached to the circuit layer 10 through the adhesive layer 11*d* and a curved part spaced apart from the circuit layer 10. The fixing part is in contact with the adhesive layer 11*d*. The fixing part is configured to attach the antenna element 11 on the circuit layer 10. The curved part is not in contact with the adhesive layer 11*d* or the circuit layer 10. Since the antenna element 11 is constrained by the fixing part, the antenna element 11 will not be moved with respect to the circuit layer 10. For example, the antenna element 11 will not be moved to other location such as the location illustrated with the dashed line 11'.

Therefore, the antenna gain deviation of the antenna element 11 can be within a predetermined value or a predetermined range. For example, the antenna gain deviation of the antenna element 11 can be between about 3 dB and 0 dB.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
a circuit layer having a surface;
a carrier including:
a fixing part connecting to surface of the circuit layer and substantially parallel to the surface of the circuit layer; and
a curved part spaced apart from the circuit layer, wherein the curved part and the surface of the circuit layer define an air cavity, and wherein a boundary of the air cavity is circular in a top view;
a first antenna pattern disposed over the carrier and separated from the air cavity by the carrier, wherein a normal line of the first antenna pattern extends through the air cavity; and
a second antenna pattern disposed across the boundary of the air cavity in the top view, wherein the second antenna pattern has a larger surface area than the first antenna pattern.

2. The semiconductor device package of claim 1, wherein the second antenna pattern includes an antenna array arranged in a circle around the first antenna pattern in the top view.

3. The semiconductor device package of claim 1, wherein the first antenna pattern has a curved appearance.

4. The semiconductor device package of claim 1, wherein the fixing part of the carrier is connected to the surface of the circuit layer through an adhesive layer, and the first antenna pattern is connected to a transmission line passing through the adhesive layer.

5. The semiconductor device package of claim 1, further comprising:
a reference layer disposed over the surface of the circuit layer, wherein the reference layer and the carrier define a resonant cavity of the air cavity.

6. The semiconductor device package of claim 1, further comprising:
a reference layer disposed over a surface of the carrier, wherein the reference layer and the circuit layer define a resonant cavity of the air cavity.

7. The semiconductor device package of claim 6, wherein the first antenna pattern and the reference layer are disposed on opposite sides of the carrier, and the reference layer has a curved appearance.

8. A semiconductor device package, comprising:

a carrier having an outer curved surface and an inner curved surface defining a cavity;

an antenna array disposed over the outer curved surface of the carrier, wherein a normal line of the antenna array extends through the cavity;

an electronic component under the carrier and electrically connected with the antenna array;

a circuit layer supporting the carrier and separating the electronic component from the cavity, wherein the carrier comprises a peripheral region connected to the circuit layer and a central region arranged away from the circuit layer, wherein a boundary of the central region is circular in a top view; and a reference layer disposed over the circuit layer, wherein the cavity between the reference layer and the carrier is configured to function as a resonant cavity, wherein an antenna pattern of the antenna array continuously extends between the peripheral region and the central region.

9. A semiconductor device package, comprising:

a circuit layer;

a carrier comprising a fixing part attached to the circuit layer and a curved part spaced apart from the circuit layer, wherein the curved part and the circuit layer define an air cavity; and an antenna pattern disposed over the carrier and separated from the air cavity by the carrier, wherein a normal line of the antenna pattern extends through the air cavity, wherein the antenna pattern comprises a first antenna array and a second antenna array, wherein an operating frequency of the first antenna array is greater than an operating frequency of the second antenna array, and wherein the second antenna array is arranged in a circle around the first antenna array in a top view.

10. The semiconductor device package of claim 9, wherein the curved part is constrained by the fixing part such that an antenna gain deviation of the antenna pattern caused by a movement of the semiconductor device package is within a predetermined value, and wherein a boundary of the curved part is circular in the top view.

11. The semiconductor device package of claim 9, wherein the antenna pattern has a curved appearance.

12. The semiconductor device package of claim 9, wherein the fixing part of the carrier is connected to the circuit layer through an adhesive layer, and the antenna pattern is connected to a transmission line passing through the adhesive layer.

* * * * *